(12) United States Patent
Liu (10) Patent No.: US 11,018,622 B2
(45) Date of Patent: May 25, 2021

(54) ELECTRICAL COUPLING APPARATUS FOR USE IN A SOLAR PHOTOVOLTAIC POWER SYSTEM AND METHODS OF OPERATING THE SAME

(71) Applicant: Entrust Smart Home Microgrid Ltd, Lancaster (GB)

(72) Inventor: Xiongwei Liu, Lancaster (GB)

(73) Assignee: ENTRUST SMART HOME MICROGRID LTD., Lancaster (GB)

( * ) Notice: Subject to any disclaimer, the term of this patent is extended or adjusted under 35 U.S.C. 154(b) by 219 days.

(21) Appl. No.: 16/313,109

(22) PCT Filed: Jun. 21, 2017

(86) PCT No.: PCT/GB2017/051825
§ 371 (c)(1),
(2) Date: Dec. 24, 2018

(87) PCT Pub. No.: WO2018/002586
PCT Pub. Date: Jan. 4, 2018

(65) Prior Publication Data
US 2019/0229673 A1     Jul. 25, 2019

(30) Foreign Application Priority Data
Jun. 29, 2016 (GB) ..................... 1611284

(51) Int. Cl.
*H02S 40/32* (2014.01)
*H02J 3/38* (2006.01)
*H01L 31/02* (2006.01)

(52) U.S. Cl.
CPC ........ *H02S 40/32* (2014.12); *H01L 31/02021* (2013.01); *H02J 3/385* (2013.01); *Y02E 10/56* (2013.01)

(58) Field of Classification Search
None
See application file for complete search history.

(56) References Cited

U.S. PATENT DOCUMENTS

2004/0211459 A1   10/2004   Takashi et al.
2009/0284232 A1   11/2009   Zhang et al.
(Continued)

FOREIGN PATENT DOCUMENTS

EP   1708070 A1   10/2006
EP   2770539 A1   8/2014
(Continued)

OTHER PUBLICATIONS

Mahmoud A., et al., An adaptive utility interactive photovoltaic system based on a flexible switch matrix to optimize performance in real-time, Solar Energy, 2012, pp. 951-963, vol. 86, Architectural Engineering—Faculty Publications.
(Continued)

*Primary Examiner* — Jared Fureman
*Assistant Examiner* — Aqeel H Bukhari
(74) *Attorney, Agent, or Firm* — Patent Law Works LLP (57) ABSTRACT

Electrical coupling apparatus for electrically coupling the output of a plurality of strings of photovoltaic modules to the input of a DC/AC inverter in parallel in a solar photovoltaic power system, the electrical coupling apparatus comprising a selective switching apparatus and at least one DC/DC converter. The selective switching apparatus may be configured to couple each of the plurality of strings of photovoltaic modules to the inverter either via a first electrical coupling path not comprising a DC/DC converter or via a second electrical coupling path comprising a DC/DC converter and selectively electrically couple any one of the plurality of strings of photovoltaic modules to the inverter via the second electrical coupling path by electrically cou- (Continued)

pling the string to the inverter via the at least one DC/DC converter.

16 Claims, 6 Drawing Sheets

(56) References Cited

U.S. PATENT DOCUMENTS

| | | | |
|---|---|---|---|
| 2010/0295381 A1 | 11/2010 | Burger et al. | |
| 2011/0285375 A1 | 11/2011 | Deboy | |
| 2012/0274139 A1* | 11/2012 | Agamy | H02J 3/385 307/71 |
| 2013/0328404 A1 | 12/2013 | Nosaka et al. | |
| 2015/0076911 A1* | 3/2015 | Pape | H02J 3/381 307/52 |
| 2016/0268806 A1* | 9/2016 | Chatterjee | H02M 7/44 |

FOREIGN PATENT DOCUMENTS

| | | |
|---|---|---|
| JP | 2000112545 A | 4/2000 |
| WO | 2009049717 | 4/2009 |

OTHER PUBLICATIONS

International Search Report and Written Opinion, PCT/GB2017/051825, dated Sep. 22, 2017 (15 pages).
Chaaban, et al., Adaptive photovoltaic system, IEEE, Glendale, AZ, USA, Nov. 7-10, 2010, pp. 3192-3197; IECON 2010—36th Annual Conference on IEEE Industrial Electronics Society, Conference Proceedings, ISBN 978-1-4244-5225-5, 1-4244-5225-2.
International Search Report and Written Opinion of International Application No. PCT/GB2017/051825, dated Sep. 22, 2017 (15 pages).
Search and Examination Report of Application No. GB1611284.9, dated Sep. 9, 2016 (9 pages).

* cited by examiner

ELECTRICAL COUPLING APPARATUS FOR USE IN A SOLAR PHOTOVOLTAIC POWER SYSTEM AND METHODS OF OPERATING THE SAME

TECHNICAL FIELD

This specification relates generally to solar photovoltaic power systems.

BACKGROUND

In recent times, there has been growing interest in solar power as an environmentally friendly alternative to other power generation methods such as the combustion of fossil fuels. Solar energy is typically harnessed using photovoltaic solar cells which, on exposure to light, generate electricity through the photovoltaic effect. In solar photovoltaic power generation, there is a need to reduce power losses in order to improve power generation efficiency.

SUMMARY

In a first aspect, this specification describes electrical coupling apparatus for electrically coupling the output of a plurality of strings of photovoltaic modules to the input of a DC/AC inverter in parallel in a solar photovoltaic power system, the electrical coupling apparatus comprising a selective switching apparatus and at least one DC/DC converter, wherein the selective switching apparatus is configured to electrically couple each of the plurality of strings of photovoltaic modules to the inverter either via a first electrical coupling path not comprising a DC/DC converter or via a second electrical coupling path comprising a DC/DC converter and selectively electrically couple any one of the plurality of strings of photovoltaic modules to the inverter via the second electrical coupling path by electrically coupling the string to the inverter via the at least one DC/DC converter.

The input voltage of the at least one DC/DC converter may be variably controllable based on received control signals.

The input voltage of the at least one DC/DC converter may be variably controllable based on maximum power point tracking of a string of photovoltaic modules that is electrically coupled via the at least one DC/DC converter.

The electrical coupling apparatus may comprise a plurality of DC/DC converters, and wherein the selective switching apparatus may be configured to selectively electrically couple any one of the plurality of strings of photovoltaic modules to the inverter via the second electrical coupling path by electrically coupling the string to the inverter via any one of the plurality of DC/DC converters.

The selective switching apparatus may comprise a plurality of normally-closed (NC) switch connections each configured to electrically couple a respective string of photovoltaic modules to the inverter via the first electrical coupling path, and a plurality of power electronic switches each configured to electrically couple a respective one of the strings to the inverter via a respective one of the DC/DC converters.

The selective switching apparatus may comprise a plurality of normally-closed (NC) switch connections, each comprising a paired movable switch throw configured to electrically connect one of the plurality of strings of photovoltaic modules and fixed switch contact configured to electrically connect the inverter and configured to electrically couple the string of photovoltaic modules to the inverter via the first electrical coupling path, and a plurality of movable switch contacts, each electrically coupled to a respective DC/DC converter, wherein when one of the plurality of NC switch connections breaks and the respective movable switch throw moves into alignment with one of the plurality of movable switch contacts, the selective switching apparatus may be configured to pair the movable switch throw and the movable switch contact and make an electrical connection between the DC/DC converter and the string previously connected via the NC switch connection.

The selective switching apparatus may further comprise a plurality of isolated switch contacts, each configured to electrically couple a respective string of photovoltaic modules via the respective movable switch throw.

The selective switching apparatus may further comprise at least one linear driver configured to move the movable switch throws and/or the movable switch contacts.

The at least one linear driver may comprise a direct current powered electromagnetic coil configured to break and/or make the switch connection between a switch throw and a switch contact when the switch throw and the switch contact are aligned.

The selective switching apparatus may further comprise at least one movable direct current powered electromagnetic coil configured to break and/or make the switch connection between a switch throw and a switch contact when the switch throw and the switch contact are aligned.

The selective switching apparatus may further comprise at least one robotic arm configured to move the movable switch throws and/or the movable switch contacts and/or the movable direct current powered electromagnetic coil.

The number of DC/DC converters may be less than or equal to the number of strings of photovoltaic modules in the solar photovoltaic power system.

In a second aspect, this specification describes a method of controlling electrical coupling apparatus for use in a solar photovoltaic power system comprising determining that the electrical coupling of a string of photovoltaic modules to an inverter is to be switched between being via a first electrical coupling path not comprising a DC/DC converter and being via a second electrical coupling path comprising a DC/DC converter, and causing the electrical coupling of the string of photovoltaic modules to the inverter to be switched between being via the first electrical coupling path and being via the second electrical coupling path.

Determining that the electrical coupling of a string of photovoltaic modules to the inverter is to be switched may be based on at least one of detected power output of the string, detected fault current of a DC/DC converter, detected power conversion efficiency of a DC/DC converter, and detected temperature of a DC/DC converter.

The method may further comprise determining that a string of photovoltaic modules is to be disconnected, and causing the string to be disconnected.

Determining that a string of photovoltaic modules is to be disconnected may be based on at least one of detected power output of the string and detected fault current of the string.

The method may further comprise determining that a DC/DC converter is to be disconnected, and causing the DC/DC converter to be disconnected.

Determining that a DC/DC converter is to be disconnected may be based on at least one of detected fault current of the DC/DC converter, detected temperature of the DC/DC converter, and detected power conversion efficiency of the DC/DC converter.

The electrical coupling apparatus according to the first aspect may further comprise control apparatus configured to perform the method according to the second aspect.

BRIEF DESCRIPTION OF THE DRAWINGS

For a more complete understanding of the apparatuses and methods described herein, reference is made now to the accompanying drawings, in which.

DETAILED DESCRIPTION

In the description and drawings, like reference numerals may refer to like elements throughout.

Figure 1A:
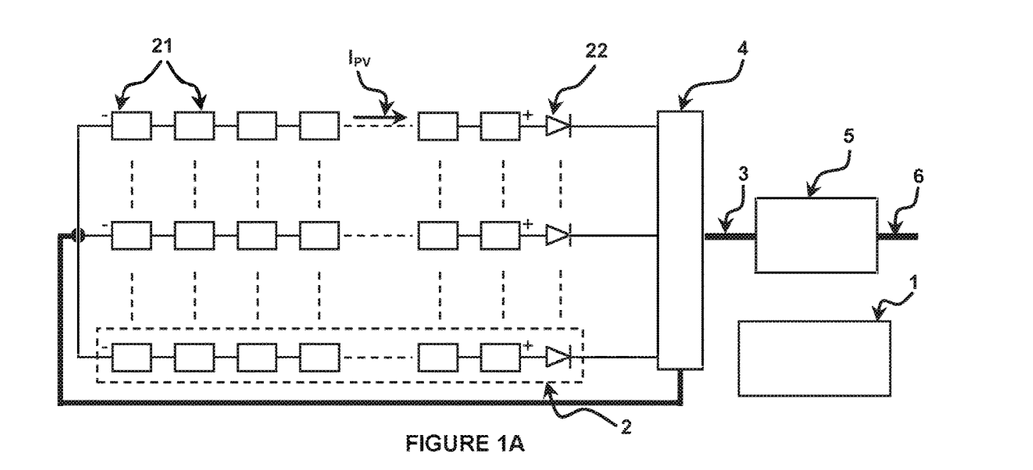
FIGS. 1A to 1C illustrate examples of three different types of solar photovoltaic power systems.
Figure 1B:
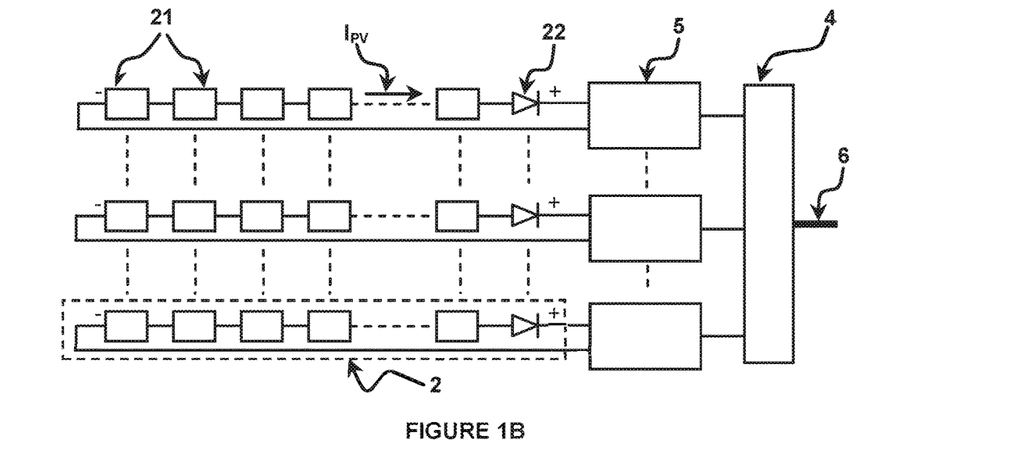
Figure 1C:
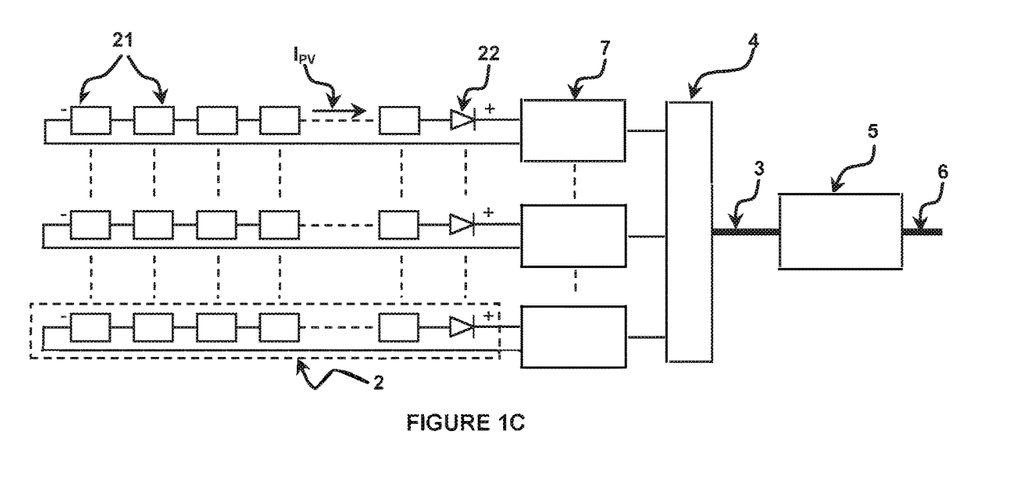

FIGS. 1A to 1C illustrate three different types of solar photovoltaic power systems.

FIG. 1A illustrates a first solar photovoltaic power system. The solar photovoltaic power system comprises a plurality of parallel strings 2 of photovoltaic modules 21. Each photovoltaic module 21 comprises one or more photovoltaic cells connected in series.

The string current $I_{PV}$ of a string 2 of photovoltaic modules 21 flows from its negative terminal to its positive terminal. Each string 2 of photovoltaic modules 21 may comprise a reverse protection diode 22 for safety reasons. The outputs of the strings 2 of photovoltaic modules 21 are combined and electrically coupled to a DC/AC inverter 5 (for instance via a combiner box 4 and a DC bus 3). The DC/AC inverter 5 electrically couples the DC bus 3 and an AC bus 6 in order to supply AC power (e.g. to an AC grid). The solar photovoltaic power system may be configured to run a system-level maximum power point tracking (MPPT) algorithm to attempt to draw the maximum power from the photovoltaic modules by controlling the input voltage of the DC/AC inverter 5. The MPPT algorithm may be run from a central controller 1 or from the DC/AC inverter 5.

In this system, all of the parallel strings 2 of photovoltaic modules 21 are forced to have the same output voltage, since the output voltage of each string 2 must match the input voltage of the DC/AC inverter 5 (which is equal to the voltage on the DC bus 3). When a photovoltaic module 21 experiences a fault or is partially shaded (e.g. by tree leaves, bird waste, dust etc.), the string 2 to which the photovoltaic module 21 belongs will suffer from lower power output. Since all of the strings 2 of photovoltaic modules 21 are forced to have the same output voltage, a poorly performing string 2 of photovoltaic modules 21 will interfere with the other strings 2 of photovoltaic modules 21 in the system and reduce the power output of the whole system. This is explained below with reference to FIGS. 2 and 3.

Figure 2:
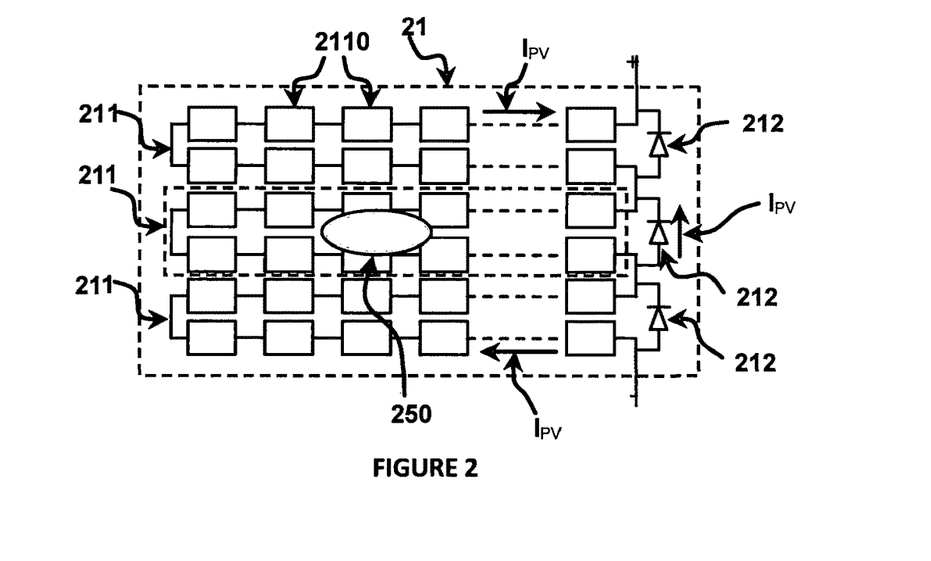
FIG. 2 illustrates an example of a poorly performing solar photovoltaic module.

FIG. 2 illustrates a poorly performing photovoltaic module 21 which may form part of the solar photovoltaic power system described above. The photovoltaic module 21 comprises one or more strings 211 of photovoltaic cells connected in series. Each string 211 of photovoltaic cells comprises one or more photovoltaic cells 2110 connected in series and is fitted with a bypass diode 212.

In the example illustrated by FIG. 2, the photovoltaic module 21 has three strings 211 of photovoltaic cells connected in series, and four photovoltaic cells 2110 in the middle string are shaded by a shadow 250. In this situation, the bypass diode 212 of the middle string 211 of photovoltaic cells is activated and the string current $I_{PV}$ flows through the bypass diode 212, thereby bypassing the middle string 211 of photovoltaic cells. Therefore, the number of working strings 211 of photovoltaic cells in the photovoltaic module 21 is reduced from three to two, and power generation from the photovoltaic module 21 is reduced.

Figure 3:
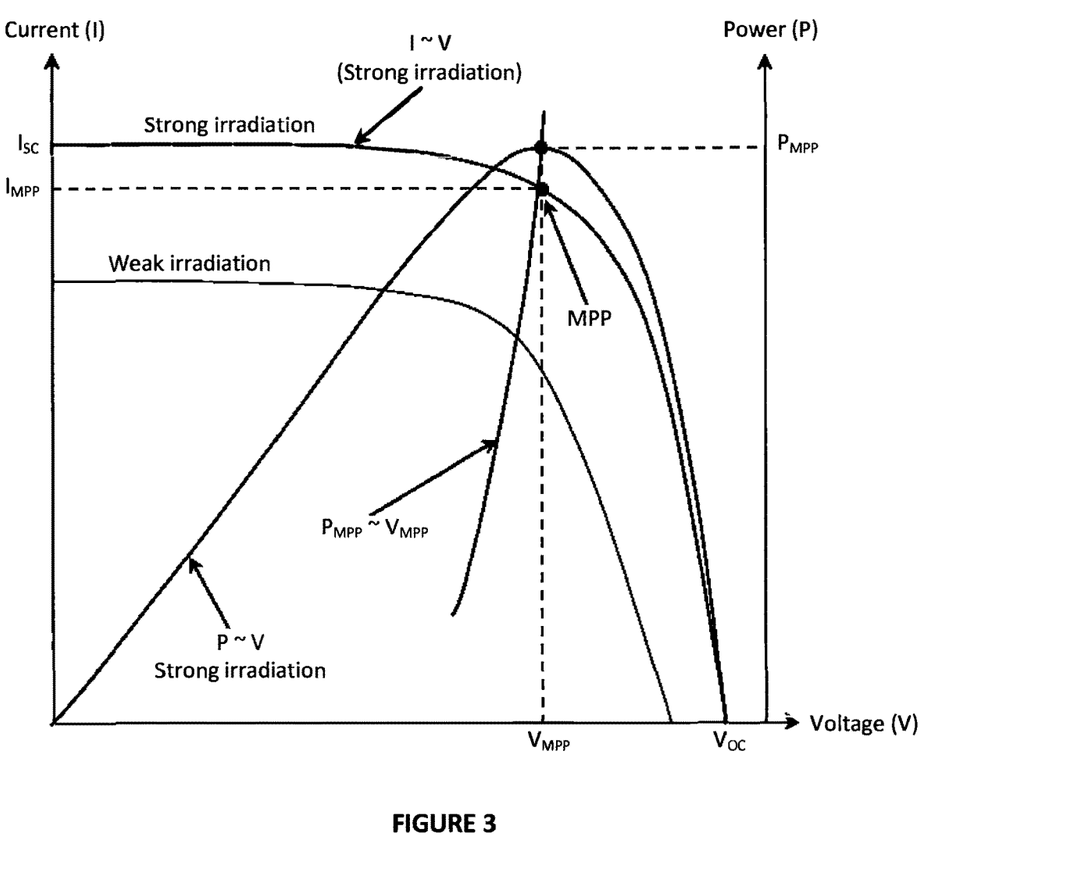
FIG. 3 is a graph illustrating the voltage-current and voltage-power characteristics of a solar photovoltaic cell.

If a poorly performing photovoltaic module 21 such as the one illustrated in FIG. 2 is in a string 2 of photovoltaic modules 21 in the system of FIG. 1A, each normally working photovoltaic module 21 in the string 2 may be forced to have a higher voltage because the output voltage of each string 2 of photovoltaic modules 21 must match the input voltage of the DC/AC inverter 5 (which is also the voltage on the DC bus 3). As illustrated by FIG. 3, if the operating voltage of a photovoltaic module 21 is higher than the optimal maximum power point voltage $V_{MPP}$, this will cause a lower power output than the maximum power output $P_{MPP}$ from the photovoltaic module 21, due to the current-voltage and power-voltage characteristics of the photovoltaic module 21 (which are illustrated in FIG. 3). This performance relationship applies to individual photovoltaic cells in the same way, since a photovoltaic module is one or more photovoltaic cells connected in series.

FIG. 1B illustrates a second solar photovoltaic power system. In this solar photovoltaic power system, each string 2 of photovoltaic modules 21 is fitted with a corresponding MPPT regulated DC/AC inverter 5. The output of each string 2 of photovoltaic modules may be electrically coupled to an AC bus 6 through its corresponding DC/AC inverter and a combiner box 4. Unlike the system of FIG. 1A, there is no common DC bus in this system. The MPPT algorithm of each string 2 may run from the corresponding DC/AC inverter 5 to attempt to draw the maximum power from each string 2 of photovoltaic modules 21 by controlling the input voltage of the DC/AC inverter 5.

FIG. 1C illustrates a third solar photovoltaic power system. In this system, each string 2 of photovoltaic modules 21 is fitted with a corresponding MPPT regulated DC/DC converter 7. The output of each string 2 of photovoltaic modules 21 may be electrically coupled to a DC/AC inverter 5 through its corresponding DC/DC converter 7, a combiner box 4 and a DC bus 3. The MPPT algorithm of each string 2 may run from the corresponding DC/DC converter 7 to attempt to draw the maximum power from each string 2 of photovoltaic modules 21 by controlling the input voltage of the DC/DC converter 7. The DC/DC converter 7 adapts its output voltage to the voltage on the DC bus 3, which matches the input voltage of the DC/AC inverter 5.

For the solar photovoltaic power systems of FIGS. 1B and 1C, even when there are poorly performing photovoltaic modules 21 (e.g. photovoltaic modules 21 that are affected by shadow and/or photovoltaic modules 21 with defective/faulty photovoltaic cells) in a particular string 2 of photovoltaic modules 21, the other strings 2 of photovoltaic modules 21 are not affected as they are in the system of FIG. 1A. This is because each string 2 of photovoltaic modules 21 is independent from the others and does not interfere with the other parallel strings 2 of photovoltaic modules 21. Moreover, since the output of each string 2 of photovoltaic modules 21 is fitted with a corresponding MPPT regulated DC/AC inverter 5 (as in FIG. 1B) or MPPT regulated DC/DC converter 7 (as in FIG. 1C), a string of photovoltaic modules which is performing poorly in these systems is still controlled to contribute the maximum power output that it can.

However, the solar photovoltaic power systems of FIGS. 1B and 1C are generally more expensive than the system of FIG. 1A since a DC/AC inverter 5 or DC/DC converter 7 is required for each string 2 of photovoltaic modules. Also, in the systems of FIGS. 1B and 1C, if one of the DC/AC inverters 5 or one of the DC/DC converters develops a fault and does not work, the corresponding string 2 of photovoltaic modules 21 is completely disconnected from the rest of the system and does not contribute to power generation at all.

This specification will hereinafter describe electrical coupling apparatus for use in a solar photovoltaic power system which may allow the solar photovoltaic power system in which it is used to benefit from the advantages of the systems of FIGS. 1A to 1C while avoiding the disadvantages.

Figure 4:
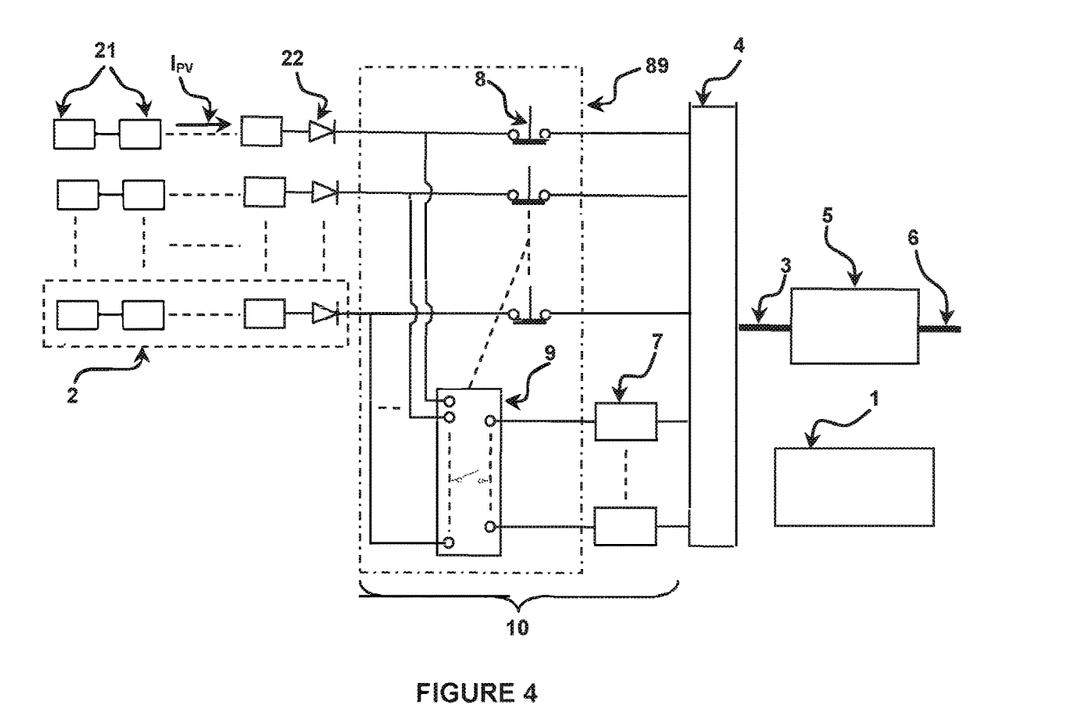
FIG. 4 illustrates an example of solar photovoltaic power system with electrical coupling apparatus.

FIG. 4 illustrates a solar photovoltaic power system which comprises a plurality of parallel strings 2 of photovoltaic modules 21, a DC/AC inverter 5 and electrical coupling apparatus 10 for electrically coupling the strings 2 of parallel photovoltaic modules 21 to the inverter 5. The strings 2 of photovoltaic modules 21 generate DC electrical power from incident light and are electrically coupled to the inverter 5 which converts the DC electrical power into AC electrical power. The AC electrical power may then be supplied elsewhere via an AC bus 6 (e.g. to an AC grid).

Each string 2 of photovoltaic modules 21 may comprise a plurality of photovoltaic modules 21 connected in series (or a single photovoltaic module). Each photovoltaic module 21 may comprise a plurality of photovoltaic cells (not shown) connected in series (or a single photovoltaic cell).

The electrical coupling apparatus m of FIG. 4 comprises at least one DC/DC converter 7. DC/DC converters 7 have the function of converting DC electrical power from one voltage level to DC electrical power of another voltage level. DC/DC converters 7 may be step-up converters which have a higher voltage output than input (also known as boost converters) or step-down converters which have a lower voltage output than input (also known as buck converters). In general, the input voltage of DC/DC converters 7 can be variably controlled, thus allowing the voltage of the output of a string 2 coupled via a DC/DC converter 7 to be controlled.

The electrical coupling apparatus 10 of FIG. 4 may be configured to selectively electrically couple the output of each of the strings 2 to the input of the inverter 5 either via a first electrical coupling path or via a second electrical coupling path. In other words, the electrical coupling apparatus m may provide two different electrical coupling paths to the inverter 5 for the output of each of the strings 2 of photovoltaic modules 21. The electrical coupling of each of the strings 2 may be selective in the sense that if the first electrical coupling path is used, the second electrical coupling path is not used, and vice versa.

The first electrical coupling path of each string 2 may be defined by the fact that it does not pass through a DC/DC converter 7 and the second electrical coupling path of each string 2 is defined by the fact that it does pass through a DC/DC converter 7. In this way, there are two possible options for the electrical coupling of each string 2—a path which does not control the voltage of the output of the string 2 with a DC/DC converter and a path which does. Generally speaking, if a string 2 of photovoltaic modules is operating under normal working conditions (e.g. no shading and/or with no faulty/defective photovoltaic cells), it is desirable to electrically couple the string 2 to the inverter 5 without passing through a DC/DC converter 7. This is because any voltage conversion inevitably involves energy loss and this may result in a reduction in power generation efficiency. Therefore, if a string 2 is operating under normal working conditions, it is desirable to electrically couple the string 2 to the inverter 5 via the first electrical coupling path. However, if a string 2 is not operating under normal working conditions (e.g. if one or more of the photovoltaic cells in the string 2 are shaded and/or are faulty/defective), the impacted (e.g. poorly performing) string 2 will tend to affect the voltages of the power output of the other strings 2 (since they are connected in parallel and must supply the same voltage to the inverter 5). In this situation, it is desirable to electrically couple the impacted string 2 via a DC/DC converter 7 so that its input voltage can be controlled and its output voltage can be adapted to match the input voltage of the inverter 5, so as to not affect the output voltages of the other strings 2. The electrical coupling of a string 2 via a DC/DC converter 7 essentially "isolates" the string from the other strings 2 so that it does not affect their voltages or power output. Therefore, it is desirable to electrically couple an impacted string 2 to the inverter 5 via the second electrical coupling path.

The electrical coupling apparatus described above allows the system of FIG. 4 to adapt to varying conditions in the operation of their photovoltaic cells by choosing the optimal electrical coupling path for each of its strings 2 so that power generation efficiency can be improved. For example, if all of the strings 2 are operating normally, then the system of FIG. 4 may allow all of the strings 2 to be electrically coupled to the inverter 5 via the first electrical coupling path (so that no string 2 is coupled via a DC/DC converter). If there is an impacted string 2, then the system of FIG. 4 may allow the impacted string 2 to be electrically coupled to the inverter 5 via the second electrical coupling path (via a DC/DC converter).

In the system of FIG. 4, the input voltage of the inverter 5 and the input voltage of the at least one DC/DC converter 7 may be variably controllable based on received control signals. In other words, the input voltage of the inverter 5 and input voltage of the at least one DC/DC converter 7 may be regulated by electronic control apparatus. In this way, system of FIG. 4 is able to control the input voltages of the inverter 5 and the at least one DC/DC converter 7 such that power generation efficiency is improved.

The input voltages of the inverter 5 and the at least one DC/DC converter 7 may be variably controlled according to any suitable criteria. For instance, the input voltage of the inverter 5 may be variably controlled based on a maximum power point tracking (MPPT) algorithm. In more detail, an MPPT algorithm may be run to variably control the input voltage of the inverter 5 such that the solar photovoltaic power system as a whole operates at the maximum power point (MPP). In other words, the output of the solar photovoltaic system as a whole may be MPPT regulated. This may be referred to as a system-level MPPT algorithm.

The input voltage of the at least one DC/DC converter 7 may also be variably controlled based on an MPPT algorithm. For example, a dedicated MPPT algorithm may be run to variably control the input voltage of the at least one DC/DC converter 7 such that a string 2 that is coupled to the at least one DC/DC converter 7 operates at its individual maximum power point. If the electrical coupling apparatus 10 comprises more than one DC/DC converter 7, each DC/DC converter 7 may be separately controlled by a respective dedicated MPPT algorithm.

It will be appreciated that many different types of MPPT algorithms exist and any suitable type may be used.

As an alternative to an MPPT algorithm, the input voltage of the inverter 5 may also be variably controlled based on monitored solar irradiation density to maximise the power output of the system. It will be appreciated that the maximum power point (MPP) voltage of a solar photovoltaic system (which is equal to the input voltage of the inverter 5 at which the system as a whole generates the maximum power) is related to the solar irradiation density. In other words, the MPP voltage of a solar photovoltaic system has a dependency on the solar irradiation density and can be calibrated against the solar irradiation density. Therefore, if the solar irradiation density is measured, the input voltage of the inverter 5 can be controlled to be a voltage which is determined (or calculated) based on the measured solar irradiation density to match the corresponding MPP voltage from the calibrated MPP voltage vs solar irradiation density curve. Other variable parameters which also affect the MPP voltage may also need to be taken into account (e.g. temperature of the environment and age of the solar photovoltaic system).

By variably controlling the input voltage of the inverter 5 and variably controlling the input voltage of the DC/DC converter 7, the system of FIG. 4 is able to provide variable control of the output voltage of individual strings 2 as well as variable control of the output voltage of the system (e.g. the voltage of the DC bus 3), which may result in further improved power generation efficiency compared to systems which are not able to variably control both of these voltages (e.g. the system of FIG. 1C). For example, if both the input voltage of the inverter 5 (which is equal to the voltage on the DC bus 3) and the input voltage of the at least one DC/DC converter 7 are both MPPT regulated, the voltage difference between the input voltage of the inverter 5 (which is equal to the output voltage of the DC/DC converter 7) and the input voltage of the at least one DC/DC converter 7 (which is equal to the output voltage of the string 2 that is coupled via the at least one DC/DC converter 7) may be reduced. This may allow the DC/DC converter 7 to operate within its optimal efficiency range for voltage conversion, thus improving the power conversion efficiency of the DC/DC converter 7.

It will be appreciated that many different inverters 5 with different types of system-level MPPT algorithms exist and any suitable inverter 5 with a system-level MPPT algorithm may be used in the system.

The electrical coupling apparatus 10 of FIG. 4 comprises a selective switching apparatus 89 configured to switch the electrical coupling of each of the plurality of strings 2 to the inverter 5 between being via the first electrical coupling path and being via the second electrical coupling path. In other words, the selective electrical coupling as described above may be achieved through the selective switching apparatus 89 of the electrical coupling apparatus 10. In general, any selective switching apparatus 89 capable of selectively switching between the first and second electrical coupling paths may be used.

In the system of FIG. 4, the selective switching apparatus 89 may comprise a plurality of normally-closed (NC) switches 8 and a plurality of selective normally-open (NO) switches 9. The selective NO switches 9 may be configured to selectively electrically couple any one of the plurality of strings 2 of photovoltaic modules 21 to the inverter 5 via the second electrical coupling path. In other words, the selective NO switches 9 may be capable of electrically coupling any string 2 to the inverter 5 via a DC/DC converter 7.

As illustrated by FIG. 4, the electrical coupling apparatus 10 may comprise a plurality of DC/DC converters 7. In this situation, the selective NO switches 9 may be configured to selectively electrically couple any one of the strings 2 to the inverter 5 via the second electrical coupling path by electrically coupling the string 2 to the inverter 5 via any one of the plurality of DC/DC converters 7. In other words, the selective NO switches 9 allow an electrical connection to be made between the output of any one of the strings 2 of photovoltaic modules 21 and any one of the plurality of DC/DC converters 7. It will be appreciated that at any one time, each DC/DC converter 7 may only electrically couple a single string 2 to the inverter 5. Therefore, the maximum number of strings 2 that can be electrically coupled to the inverter 5 via the second electrical coupling path at any one time may be equal to the total number of DC/DC converters 7 in the electrical coupling apparatus 10. It will be appreciated that the total number of DC/DC converters 7 in the electrical coupling apparatus 10 may range from 1 to the total number of strings 2. In other words, the number of DC/DC converters 7 may be less than or equal to the number of strings 2 in the system.

It will be appreciated that, since it is only desirable for a string 2 to be coupled via the second electrical coupling path if it is impacted (e.g. performing poorly), there may not be a need for the total number of DC/DC converters 7 to match the number of strings 2. In practice, it is unlikely that a large number of strings 2 will be impacted at the same time. Therefore, the electrical coupling apparatus 10 may include fewer DC/DC converters 7 than the total number of strings 2, thereby to save on the amount of equipment required (and thus associated costs), while still being able to operate the solar photovoltaic power system with improved efficiency in all but the most extreme cases of impacted (e.g. poorly performing) strings 2.

In the system of FIG. 4, each of the plurality of strings 2 may be connected to the inverter 5 either through a normally-closed (NC) switch connection 8 (the first electrical coupling path) or through a normally-open (NO) switch connection selected from the selective NO switches 9 (the second electrical coupling path). The first electrical coupling path of each string 2 may connect the output of the string 2 to the inverter 5 through a NC switch connection 8, a combiner box 4 and a DC bus 3. The second electrical coupling path of each string 2 may connect the output of the string 2 to the inverter 5 through a NO switch connection selected from the selective NO switches 9, a DC/DC converter 7, a combiner box 4 and a DC bus 3. As illustrated by FIG. 4, the outputs of all of the DC/DC converters 7 may be connected to the DC bus 3 through the combiner box 4.

The NC switch connection 8 and the NO switch connection selected from the selective NO switches 9 may be "interlocked" with each other using an interlock mechanism. In other words, if the NC switch connection 8 is in an "on" state then the NO switch connection is in an "off" state, and vice versa. In this way, it may be ensured that the NC switch connection 8 and the NO switch connection selected from the selective NO switches 9 are not both in an "on" state simultaneously. However, the NC switch connection 8 and the NO switch connection selected from the selective NO switches 9 may be both in an "off" state simultaneously. In this way, it may be ensured that a string may be isolated completely when the string 2 experiences a malfunction (e.g. a severe problem) and has to be isolated completely for repair or replacement. For example, each of the strings 2 may be fitted with sensors and/or transducers which monitor various characteristics of the string 2. If it is detected that a monitored characteristic of a string indicates that the string 2 is malfunctioning, the system may be electronically controlled to disconnect the malfunctioning string 2 from the rest of the system. Such monitored characteristics may comprise any one of or any combination of: the power output of the string 2 and the fault current of the string 2. This interlock mechanism may be electronically controlled.

For safety reasons, each string 2 may be fitted with a surge protection unit (not shown) at its output.

Figure 5:
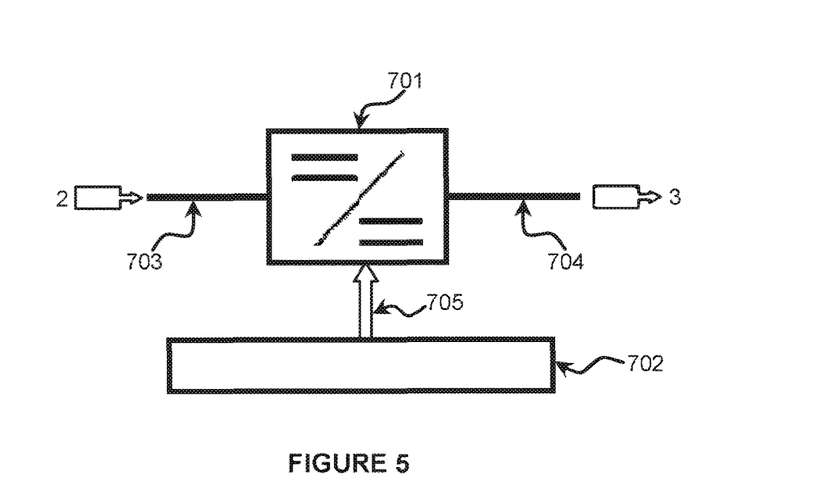
FIG. 5 illustrates an example of a DC/DC converter which may be used in the solar photovoltaic power system of FIG. 4.

FIG. 5 illustrates a DC/DC converter 701 which may be used in the system of FIG. 4. The DC/DC converter 701 may be a MPPT regulated DC/DC converter as described above. The DC/DC converter 701 comprises an input terminal 703 and an output terminal 704. The DC/DC converter 701 may be configured to receive DC power of variably controlled voltage from a string 2 at its input terminal 703 and output DC power at a higher voltage than the input voltage through its output terminal 704. In other words, the DC/DC converter 701 may be a boost converter. The DC/DC converter 7 may be fitted with a switch (not shown) so that the DC/DC converter 7 can be isolated and removed from the rest of the system for repair, replacement or maintenance when necessary.

The DC/DC converter 701 may be electronically controlled by control signals 705 sent by a dedicated controller 702. The dedicated controller 702 may be configured to control various characteristics of the DC/DC converter 701. For example, the dedicated controller 702 may monitor the fault current, the temperature and the power conversion efficiency of the DC/DC converter 701 through signals received from sensors and/or transducers. When a monitored characteristic indicates that the DC/DC converter is malfunctioning (e.g. has severe problem), the dedicated controller 702 may take action to isolate the DC/DC converter 701 from the rest of the system (for example by disconnecting the DC/DC converter 701 using a switch).

Referring to FIG. 4, it will be appreciated that the selective switching apparatus 89 can be implemented in a number of ways, as long as it is able to perform the switching functions described above.

Figure 6A:
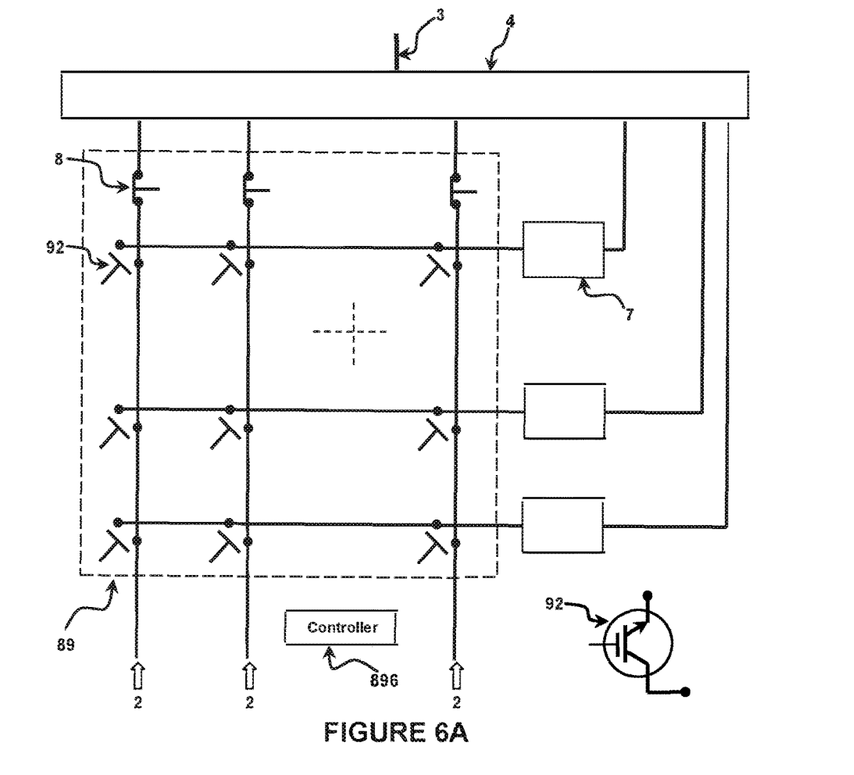
FIG. 6A illustrates an example of a selective switching apparatus which may be used in the electrical coupling apparatus of FIG. 4.

FIG. 6A illustrates an example selective switching apparatus 89 which may be used in the system of FIG. 4. This selective switching apparatus 89 may comprise a plurality of NC switch connections 8 and a plurality of power electronic switches 92 (which represent normally-open switch connections). Each of the plurality of NC switch connections 8 may be connected to the inverter 5 (e.g. via a DC bus 3 and a combiner box 4). Each of the plurality of the power electronic switches 92 may be connected to a DC/DC converter 7 (for example, a DC/DC converter as described above with reference to FIG. 5). The output of each DC/DC converter 7 may be connected to the inverter 5 (e.g. via the DC bus 3 and the combiner box 4). The power electronic switches 92 may be, for example, insulated-gate bipolar transistor (IGBT) switches (as illustrated in FIG. 6A), but are not limited as such. In general, any suitable type of power electronic switch may be used.

As illustrated in FIG. 6A, each power electronic switch 92 may be associated with only one string 2 and only one DC/DC converter 2. In other words, the power electronic switches 92 may form an array (or matrix) in which each power electronic switch 92 may be configured to electrically couple a respective one of the strings 2 to a respective one of the DC/DC converters 7. As such, the total number of the power electronic switches 92 may be equal to the number of the strings 2 multiplied by the number of the DC/DC converters 7.

In order to implement the selective switching functions described above with reference to FIG. 4, each power electronic switch 92 may be interlocked with a NC switch connection 8. Each NC switch connection 8 may be interlocked with a plurality of power electronic switches 92. In more detail, when a NC switch connection 8 of a string 2 is in an "on" state, all of the power electronic switches 92 interlocked with the NC switch connection are in an "off" state. When a particular string 2 is selected to be electrically coupled via a particular DC/DC converter 7, the corresponding power electronic switch 92 is set to be in an "on" state, the NC switch connection 8 of the string 2 is deactivated and set to be in an "off" state, and the rest of the power electronic switches 92 that are interlocked with the NC switch connection 8 of the string 2 are kept in an "off" state. This interlock mechanism may be controlled by control signals from a dedicated controller 896 of the selective switching apparatus 89.

Figure 6B:
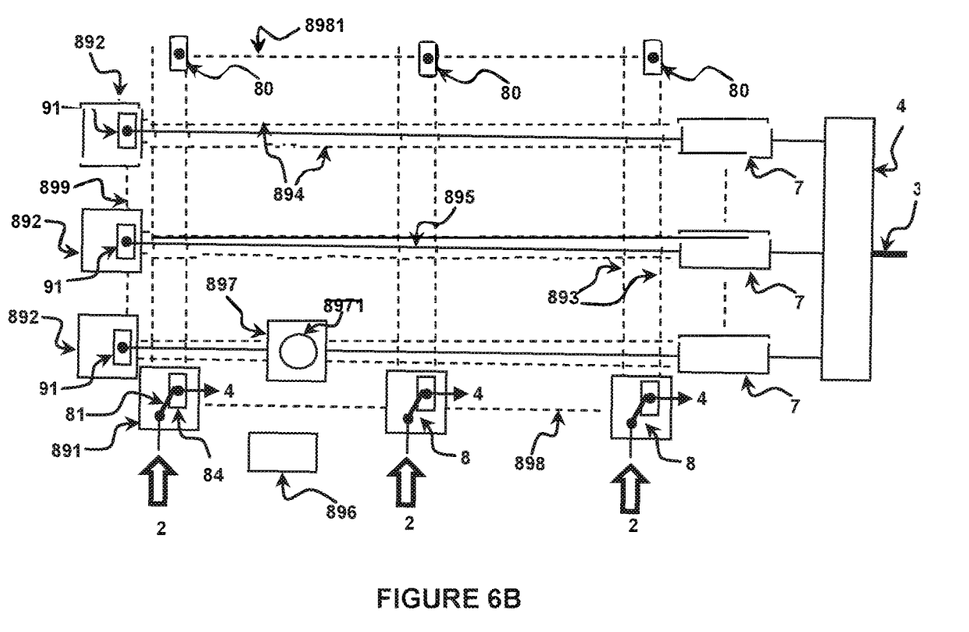
FIG. 6B illustrates an another example of a selective switching apparatus which may be used in the electrical coupling apparatus of FIG. 4.

FIG. 6B illustrates another type of selective switching apparatus 89 which can be used in the system of FIG. 4. This selective switching apparatus 89 may comprise a plurality of NC switch connections 8 and a plurality of switch contacts 91 (which represent normally-open switch connections). Each of the plurality of NC switch connections 8 may be connected to the inverter 5 (e.g. via a DC bus 3 and a combiner box 4). For example, each of the plurality of NC switch connections 8 may be formed by a switch throw 81 in contact with a fixed switch contact 84. The switch throw 81 is configured to connect a string 2, and the fixed switch contact 84 is configured to connect the inverter 5 (e.g. via a DC bus 3 and a combiner box 4). In other words, the switch throw 81 and the fixed switch contact 84 may form a double pole, single throw (DPST) switch. In this situation, a spring (not shown) may be fitted with the switch throw 81 to push the switch throw 81 in contact with the fixed switch contact 84 such that the NC switch connection 8 is firmly established.

The NC switch connection 8 may be broken by pushing the switch throw 81 to an open position through an external force, which may be, for example, a magnetic force, but are not limited as such.

Each switch throw 81 may be mounted on a movable cart 891, which may be movable along a rail 893. The movable cart 891 may be able to position itself at any position 895 of a plurality of designated positions along the rail 893.

Each of the plurality of the switch contacts 91 may be connected to a respective DC/DC converter 7 (for example a DC/DC converter as described above with reference to FIG. 5). The output of each DC/DC converter 7 may be connected to the inverter 5 (e.g. via the DC bus 3 and the combiner box 4). Similarly to the switch throw 81, each switch contact 91 may be mounted on a movable cart 892, which may be movable along a rail 894. The movable cart 892 may be able to position itself at any position of a plurality of designated positions 895 along the rail 894.

The rails 893 along which the carts of the switch throws 81 are movable may be parallel to each other, and the rails 894 along which the carts of the switch contacts 91 are movable may be also parallel to each other. The rails 893 along which the carts of the switch throws 81 are movable and the rails 894 along which the carts of the switch contacts 91 are movable may be arranged such that they extend in different directions to each other. For example, the rails 893 along which the carts of the switch throws 81 are movable and the rails 894 along which the carts of the switch contacts 91 are movable may form a matrix, for instance by being arranged to be perpendicular to each other. The carts of the switch throws 81 and the carts of the switch contacts 91 may be respectively arranged on two different layers with a gap between the two layers. The gap between the two layers may be small enough that a switch throw 81 and a switch contact 91 can pair and form a relay-type switch. In other words, when the cart 891 carrying the switch throw 81 and the cart 893 carrying the switch contact 91 move into alignment on their respective layers, the spring associated with the switch throw 81 may be released and push the switch throw 81 in contact with the switch contact 91 and make an electrical connection between the switch contact 91 and the string 2 previously connected via NC switch connection 8. In other words, a switch throw 81 and a switch contact 91 may form a single pole, double throw (SPDT) relay type switch.

Each crossing point of the rails 893 along which the carts of the switch throws 81 are movable and the rails 894 along which the carts of the switch contacts 91 are movable may be a potential position at which a switch throw 81 and a switch contact 91 can align and interact to as described above. In this way, the selective switching apparatus 89 may be able to selectively electrically couple any one of the strings 2 to the inverter 5 via any one of the DC/DC converters 7.

When the system does not require any of the strings 2 to be electrically coupled via a DC/DC converter 7, all of the NC switch connections 8 and all of the switch contacts 91 may be located at their respective home positions 898, 899. The home positions 898, 899 may be positions at the ends of the rails 893, 894.

Each of the carts 891 which carry the switch throws 81 may be located at a maintenance position 8981. At the maintenance position 8981, a fixed insulator contact 80 may be arranged. For example, when a cart 891 which carry a switch throw 81 moves into its maintenance position 8981, the spring associated with the switch throw 81 may be released and push the switch throw 81 in contact with the fixed insulator contact 80. In this way, the respective string 2 connected to the switch throw 81 may be disconnected (isolated) from the system when the string 2 experiences a malfunction (e.g. a severe problem). The maintenance positions 8981 may be positions at the ends of the rails 893, as illustrated by FIG. 6B.

It will be appreciated that the maintenance positions 8981 may be also located (not shown) close to the home positions 898 of the NC switch connections 8 at the ends of the rails 893.

Figure 6C:
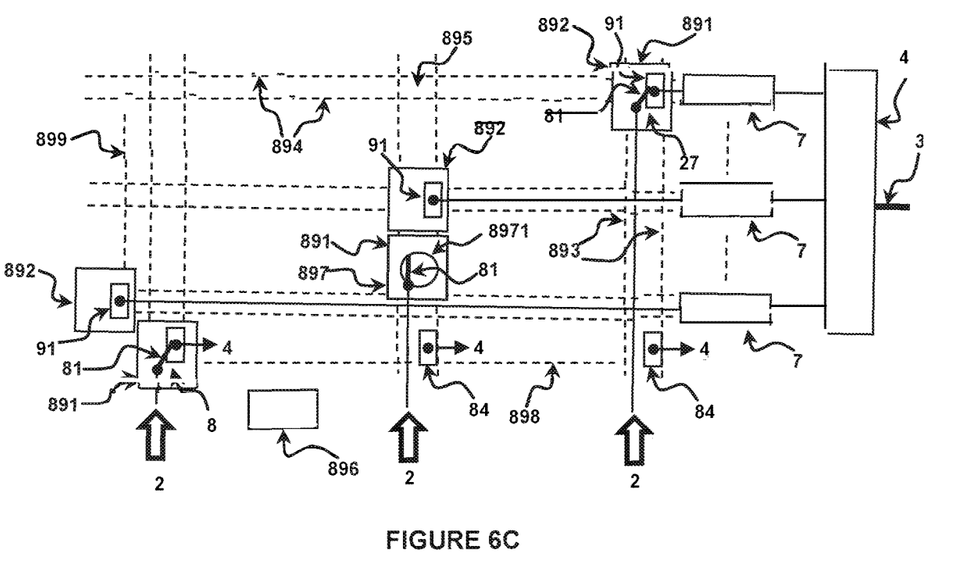
FIGS. 6C and 6D illustrate example of driving mechanisms which may be used in the selective switching apparatus of FIG. 6B.

As illustrated by FIG. 6C, the selective switching apparatus 89 may comprise a driving cart 897 configured to move along the rails 893, 894 and drive the carts 891 which carry the switch throws 81 and the carts 892 which carry the switch contacts 91. The driving cart 897 may be arranged on a third layer (not shown) which is configured to differ from the two layers arranged for the carts 891 which carry the switch throws 81 and the carts 892 which carry the switch contacts 91. The driving cart 897 may be electronically controlled by the dedicated controller 896 of the selective switching apparatus 89. The driving cart 897 may be configured to carry an electromagnetic coil 8971 powered by a DC power source (not shown), which may be, for example, a battery, but are not limited as such. It will be appreciated that, the driving cart 897 may be located anywhere along the rails 893, 894, and a home position (not shown) may be allocated for the driving cart 897. At the home position, the DC power source (e.g. the battery) of the electromagnetic coil 8971 may be recharged.

The driving cart 897 may be driven by any electronically controllable actuator, for example, a linear motor (not shown) powered by a DC power source (not shown), but is not limited as such.

The DC power source for the linear motor may be, for example, the same DC power source for the electromagnetic coil 8971, but is not limited as such.

When a string 2 is detected performing poorly (e.g. one or more of the photovoltaic cells in the string 2 are shaded and/or are faulty/defective), the driving cart 897 may be instructed (e.g. by the controller 896) to move a selected cart 892 which carries a switch contact 91 along the rail 894 to a specific position 895 which crosses the rail 893 corresponding to the string 2. Then the driving cart 897 drops and locates the cart 892 at the position 895 and then moves to the respective cart 891 which carrying the switch throw 81 which connects the poorly performing string 2. When the driving cart 897 aligns with the cart 891 carrying the switch throw 81 which is in contact with the fixed switch contact 84, the electromagnetic coil 8971 may be activated (for example, by switching on the associated DC power source) and a magnetic force may be exerted on the switch throw 81 and pull the switch throw 81 to an open state and break the NC switch connection 8. When the NC switch connection 8 is broken, the driving cart 897 may move the cart 891 which carries the switch throw 81 at its open state along the rail 893 to the respective position 895. When the cart 891 carrying the switch throw 81 moves into alignment with the cart 892 carrying the switch contact 97, the electromagnetic coil 8971 may be deactivated (for example, by switching off the associated DC power source), the magnetic force pulling the switch throw 81 disappears and the spring associated with the switch throw 81 is released to push the switch throw 81 in contact with the switch contact 91 and which makes an electrical connection 27 between the switch contact 91 and the string 2 previously connected via the NC switch connection 8. In other words, a switch throw 81 and a switch contact 91 may form a single pole, double throw (SPDT) relay type switch.

When an electrical connection 27 currently in use is no longer required (i.e. when the system no longer requires the respective string 2 to be electrically coupled to the inverter 5 via a DC/DC converter 7), the driving cart 897 may move into the electrical connection 27, the electromagnetic coil 8971 may be activated (by switching on the associated DC power source) and a magnetic force is exerted on the switch throw 81 and pulls the switch throw 81 to the open state which breaks the electrical connection 27. Then the driving cart 897 may move the cart 891 carrying the switch throw 81 at its open state along the rail 893 to the home position 898 of the respective NC switch connection 8, the electromagnetic coil 8971 is then deactivated (by switching off the associated DC power source), the magnetic force pulling the switch throw 81 disappears and the spring associated with the switch throw 81 is then released to push the switch throw 81 in contact with the fixed switch contact 84 and which makes an electrical connection between the fixed switch contact 84 and the string 2 (e.g. the NC switch connection 8 is reformed). Then the driving cart 897 may be instructed to move the switch contact 91 to its respective home position 899.

As illustrated by FIGS. 6B and 6C, the total number of movable carts 891 of switch throws 81 may be equal to the total number of strings 2, and the total number of movable carts 892 of switch contacts 91 may be equal to the total number of DC/DC converters 7.

Figure 6D:
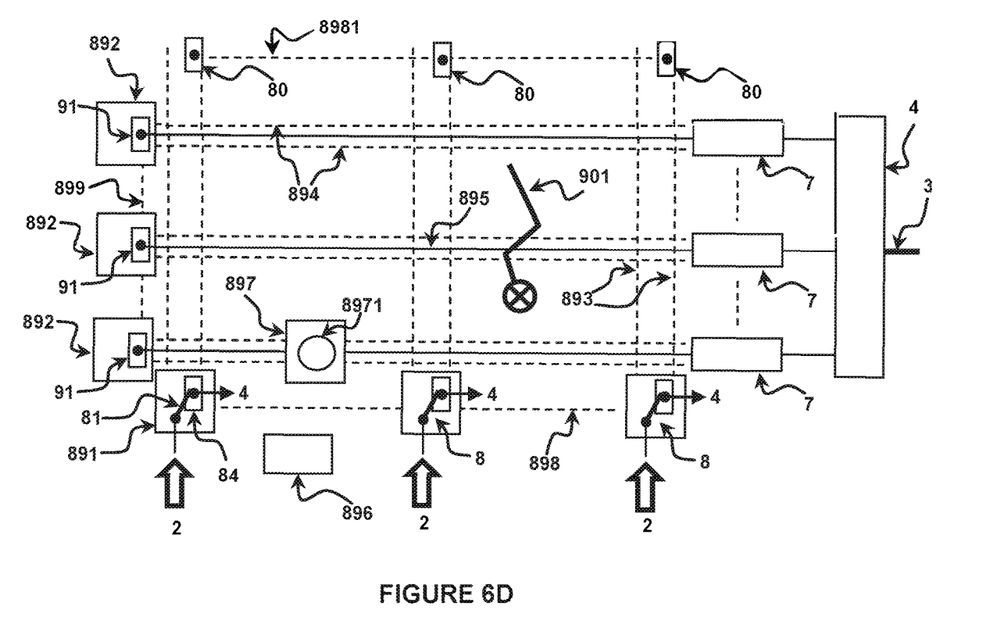

Alternatively, as illustrated in FIG. 6D, the selective switching apparatus 89 may comprise one or more robotic arms 901 for moving the carts. For example, the selective switching apparatus 89 may comprise a robotic arm 901 configured to move the carts 891 which carry the switch throws 81 and the carts 892 which carry the switch contacts 91 and the cart 897 which carry the electromagnetic coil 8971. The robotic arm 901 may be electronically controlled by the dedicated controller 896 of the selective switching apparatus 89. It will be appreciated that, in this example, the cart 897 described above may not be a driving cart (e.g. without an actuator, such as a linear motor). It will be also appreciated that, in some examples, the rails 893, 894 described above may be omitted entirely and the carts 891, 892 may be moved and positioned by the robotic arm 901 on any suitable surface. The robotic arm 901 may be located such that they are able to reach any position to which the carts 891, 892, 897 need to be moved.

It will be appreciated that a large solar photovoltaic power system may comprise a plurality of systems of FIG. 4. In other words, a plurality of electrical coupling apparatuses 10 may be combined in parallel (e.g. via a plurality of combiner boxes 4) and connected to an inverter 5 (e.g. via a DC bus 3). The inverter 5 may comprise a plurality of inverters connected to the DC bus 3 in parallel.

In general, the system of FIG. 4 may comprise control apparatus configured to electronically control the operations of the system.

The control apparatus may comprise a central controller 1 (as illustrated in FIG. 4) configured to control the input voltage of the inverter 5 (e.g. based on an MPPT algorithm or solar irradiation density), to monitor the performance of the system as a whole, and to manage the operation of the system as a whole. For example, the central controller 1 may communicate with other controllers in the system to control the overall operations of the system.

The control apparatus may also comprise a dedicated controller 702 for each DC/DC converter 701, as illustrated by FIG. 5. The dedicated controller 702 may be configured to control the operations of its respective DC/DC converter as described above with reference to FIG. 5.

In the system of FIG. 4, the control apparatus may comprise a dedicated controller 896 of the selective switching apparatus 89 (for example as illustrated by FIGS. 6A to 6D). The dedicated controller 896 may be configured to monitor performance and diagnose problems of the strings 2. For example, the dedicated controller 896 may be configured to monitor the power output and/or fault current (or short circuit current) of the strings 2 through signals received from sensors and/or transducers. When a severe problem is diagnosed for a specific string 2, the dedicated controller 896 may be configured to take action to isolate the string 2 from the rest of the system. The dedicated controller 896 of the selective switching apparatus 89 may be configured to control the operations of the selective switching apparatus 89, as described above with reference to FIGS. 6A to 6D.

It will be appreciated that, in general, the electronic control operations described herein may be controlled from any appropriate location and performed by any type of suitable control apparatus or combination of control apparatuses. There is no specific limitation to the dedicated controller/central controller arrangement described above.

The various operations performed by the control apparatus of the system of FIG. 4 will now be described in more detail with reference to FIGS. 7A to 7C.

Figure 7A:
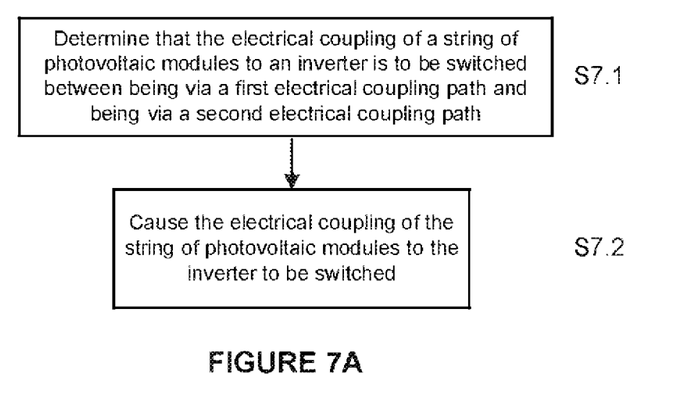
FIGS. 7A to 7C illustrate examples of various operations that may be performed by control apparatus of electrical coupling apparatus for use in a solar photovoltaic power system.

As illustrated by FIG. 7A, the control apparatus may be configured to determine that the electrical coupling of a string 2 to the inverter 5 is to be switched between being via the first electrical coupling path and being via the second electrical coupling path (S7.1). The control apparatus may be configured to then cause the electrical coupling of the string 2 to the inverter 5 to be switched between being via the first electrical coupling path and being via the second electrical coupling path (S7.2). In this way, the selective switching as described above may be caused by control signals sent by the control apparatus.

The control apparatus may be configured to determine that the electrical coupling of a string 2 to the inverter 5 is to be switched based on at least one of: detected power output of a string 2, detected power conversion efficiency of a DC/DC converter 7, and detected temperature of a DC/DC converter 7. For example, if the control apparatus receives signals indicating that the power output of a string 2 is lower than a certain value (e.g. if the power output is lower than the power output of a normally working string 2), the control apparatus may control the electrical coupling apparatus m to switch the electrical coupling of the string 2 from being coupled via the first electrical coupling path to being coupled via the second electrical coupling path.

Figure 7B:
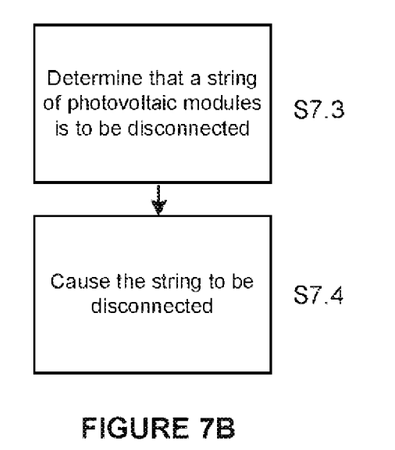

As illustrated by FIG. 7B, the control apparatus may be configured to determine that a string 2 is to be disconnected (e.g. isolated) from the rest of the system (S7.3). The control apparatus may be configured to then cause the string 2 to be disconnected (S7.4). The control apparatus may be configured to determine that a string 2 is to be disconnected based on at least one of: detected power output of the string 2 and detected fault current of the string 2. For example, if the control apparatus receives signals indicating that the power output of the string 2 is too low (for example, if the power output has fallen out of the working range of the DC/DC converter 7) or signals indicating a fault current, the control apparatus may cause the string 2 to be disconnected from the rest of the system.

Figure 7C:
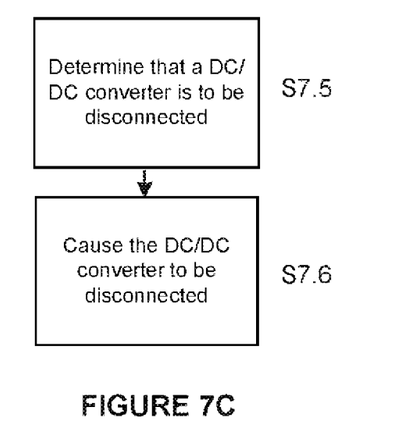

As illustrated by FIG. 7C, the control apparatus may be configured to determine that a DC/DC converter 7 is to be disconnected (S7.5). The control apparatus may be configured to then cause the DC/DC converter to be disconnected (S7.6). The control apparatus may be configured to determine that a DC/DC converter is to be disconnected based on at least one of: fault current of the DC/DC converter 7, temperature of the DC/DC converter 7 and power conversion efficiency of the DC/DC converter 7. For example, if the control apparatus receives signals indicating that the DC/DC converter 7 is short circuited and experiences a high fault current, that the power conversion efficiency of the DC/DC converter 7 is too low or that the temperature of the DC/DC converter is too high, the control apparatus may cause the DC/DC converter 7 to be disconnected from the rest of the system.

In the system of FIG. 4, if a DC/DC converter 7 which is electrically coupling a string 2 to the inverter 5 via the second electrical coupling path malfunctions and is disconnected, the control apparatus may be configured to respond by causing the string 2 to be connected to another DC/DC converter. In other words, the control apparatus may select another available (not engaged or currently in use) DC/DC converter 7 and electrically couple the string 2 to the inverter 5 via the newly selected DC/DC converter 7, thereby allowing the string 2 to still be coupled via the second electrical coupling path. In this way, the system of FIG. 4 may be able to handle the malfunctioning of DC/DC converters 7 without power generation efficiency being affected. In this situation, only when all of the DC/DC converters 7 are unavailable or engaged will the string 2 need to be switched back to being coupled via the first electrical coupling path.

In the system of FIG. 4, in situations in which there are more impacted (e.g. poorly performing) strings 2 than the number of available DC/DC converters 7, the control apparatus may be configured to control the electrical coupling of the strings 2 such that less severely impacted strings 2 are coupled via the first electrical coupling path and more severely impacted strings 2 are coupled via the second electrical coupling path, so as to mitigate the effect of the impacted strings 2. This may improve the overall power conversion efficiency of the system in situations in which there are many impacted strings 2. In this circumstance, it may be necessary for the system operator to undertake major maintenance action in order to reduce the number of impacted strings 2.

Although various aspects of the invention are set out in the independent claims, other aspects of the invention comprise other combinations of features from the described embodiments and/or the dependent claims with the features of the independent claims, and not solely the combinations explicitly set out in the claims.

It is also noted herein that while the above describes various examples, these descriptions should not be viewed in a limiting sense. Rather, there are several variations and modifications which may be made without departing from the scope of the present invention as defined in the appended claims.

The invention claimed is:

1. Electrical coupling apparatus for electrically coupling an output of a plurality of strings of photovoltaic modules to an input of a DC/AC inverter in parallel in a solar photovoltaic power system, the electrical coupling apparatus comprising:
   a selective switching apparatus; and
   n DC/DC converters, n being a positive integer number at least n=2,
   wherein:
   n is less than or equal to the number of the plurality of strings of photovoltaic modules; and
   the selective switching apparatus is configured to:
      couple each of the plurality of strings of photovoltaic modules to the inverter either via a first electrical coupling path not comprising a DC/DC converter or via a second electrical coupling path comprising a DC/DC converter; and
      selectively electrically couple any one of the plurality of strings of photovoltaic modules to the inverter via the second electrical coupling path by electrically coupling the string to the inverter via any one of the n DC/DC converters.

2. The electrical coupling apparatus of claim 1, wherein an input voltage of each currently-coupled one of the n DC/DC converters is variably controllable based on received control signals.

3. The electrical coupling apparatus of claim 2, wherein the input voltage of each currently-coupled one of the n DC/DC converters is variably controllable based on maximum power point tracking of the string of photovoltaic modules that is currently electrically coupled to the DC/DC converter.

4. The electrical coupling apparatus of claim 1, wherein the selective switching apparatus comprises:
   a plurality of normally-closed (NC) switch connections each configured to electrically couple a respective string of photovoltaic modules to the inverter via the first electrical coupling path; and
   a plurality of power electronic switches each configured to electrically couple a respective one of the strings to the inverter via a respective DC/DC converter.

5. The electrical coupling apparatus of claim 1, wherein the selective switching apparatus comprises:
   a plurality of normally-closed (NC) switch connections, each comprising a paired movable switch throw configured to electrically connect one of the plurality of strings of photovoltaic modules and fixed switch contact configured to electrically connect the inverter, and configured to electrically couple the string of photovoltaic modules to the inverter via the first electrical coupling path; and
   a plurality of movable switch contacts, each electrically coupled to a respective DC/DC converter, wherein when one of the plurality of NC switch connections breaks and the respective movable switch throw moves into alignment with one of the plurality of movable switch contacts, the selective switching apparatus is configured to pair the movable switch throw and the movable switch contact and make an electrical connection between the DC/DC converter and the string previously connected via the NC switch connection.

6. The electrical coupling apparatus of claim 5, wherein the selective switching apparatus comprises a plurality of isolated switch contacts, each configured to electrically couple a respective string of photovoltaic modules via the respective movable switch throw.

7. The electrical coupling apparatus of claim 5, wherein the selective switching apparatus comprises at least one linear driver configured to move the movable switch throws and/or the movable switch contacts.

8. The electrical coupling apparatus of claim 7, wherein the at least one linear driver comprises a direct current powered electromagnetic coil configured to break and/or make the switch connection between a switch throw and a switch contact when the switch throw and the switch contact are aligned.

9. The electrical coupling apparatus of claim 5, wherein the selective switching apparatus comprises at least one movable direct current powered electromagnetic coil configured to break and/or make the switch connection between a switch throw and a switch contact when the switch throw and the switch contact are aligned.

10. The electrical coupling apparatus of claim 9, wherein the selective switching apparatus comprises at least one robotic arm configured to move the movable switch throws and/or the movable switch contacts and/or the movable direct current powered electromagnetic coil.

11. A method of controlling electrical coupling apparatus for use in a solar photovoltaic power system comprising:

determining that an electrical coupling of a string of photovoltaic modules to an inverter is to be switched between being via a first electrical coupling path not comprising a DC/DC converter and being via a second electrical coupling path comprising the DC/DC converter based on a detected power output of the string of photovoltaic modules; and causing the electrical coupling of the string of photovoltaic modules to the inverter to be switched between being via the first electrical coupling path and being via the second electrical coupling path.

12. The method of claim 11, further comprising:

determining that the string of photovoltaic modules is to be disconnected and causing the string to be disconnected.

13. The method of claim 12, wherein determining that the string of photovoltaic modules is to be disconnected is based on at least one of:

detected power output of the string; and detected fault current of the string.

14. The method of claim 11, further comprising:

determining that the DC/DC converter is to be disconnected and causing the DC/DC converter to be disconnected.

15. The method of claim 14, wherein determining that the DC/DC converter is to be disconnected is based on at least one of:

detected fault current of the DC/DC converter;

detected temperature of the DC/DC converter; and detected power conversion efficiency of the DC/DC converter.

16. Electrical coupling apparatus for electrically coupling the output of a plurality of strings of photovoltaic modules to an input of a DC/AC inverter in parallel in a solar photovoltaic power system, the electrical coupling apparatus comprising:

a selective switching apparatus; and n DC/DC converters, n being a positive integer number at least n=2, wherein n is less than or equal to the number of the plurality of strings of photovoltaic modules, and the selective switching apparatus is configured to:

couple each of the plurality of strings of photovoltaic modules to the inverter either via a first electrical coupling path not comprising a DC/DC converter or via a second electrical coupling path comprising a DC/DC converter; and selectively electrically couple any one of the plurality of strings of photovoltaic modules to the inverter via the second electrical coupling path by electrically coupling the string to the inverter via any one of the n DC/DC converters, wherein the electrical coupling apparatus further comprises control apparatus configured to:

determine that the electrical coupling of a string of photovoltaic modules to the DC/AC inverter is to be switched between being via the first electrical coupling path not comprising a DC/DC converter and being via the second electrical coupling path comprising a DC/DC converter; and cause the electrical coupling of the string of photovoltaic modules to the DC/AC inverter to be switched between being via the first electrical coupling path and being via the second electrical coupling path.

* * * * *